United States Patent [19]

Shirotori et al.

[11] Patent Number: 5,153,699
[45] Date of Patent: Oct. 6, 1992

[54] SEMICONDUCTOR DEVICE

[75] Inventors: Tsukasa Shirotori; Kazuhiro Sawada, both of Yokohama; Takayasu Sakurai, Tokyo, all of Japan

[73] Assignee: Kabushiki Kaisha Toshiba, Kawasaki, Japan

[21] Appl. No.: 717,177

[22] Filed: Jun. 18, 1991

Related U.S. Application Data

[63] Continuation of Ser. No. 309,571, Feb. 13, 1989, abandoned.

[30] Foreign Application Priority Data

Feb. 15, 1988 [JP] Japan ................... 63-32029

[51] Int. Cl.⁵ ............... H01L 27/08; H01L 21/88
[52] U.S. Cl. .................... 357/47; 357/50; 357/54
[58] Field of Search .................. 357/54, 45, 48

[56] References Cited

U.S. PATENT DOCUMENTS

| | | | |
|---|---|---|---|
| 4,163,245 | 7/1979 | Kinoshita | 357/51 |
| 4,280,070 | 7/1981 | Reese et al. | 307/279 |
| 4,424,526 | 1/1984 | Dennard et al. | 357/47 |
| 4,587,542 | 5/1986 | Rao | 357/23.6 |
| 4,597,805 | 7/1986 | Rao | 357/91 |
| 4,602,270 | 7/1986 | Finegold et al. | 357/68 |
| 4,661,833 | 4/1987 | Mizutani | 357/54 |
| 4,701,884 | 10/1987 | Aoki et al. | 365/189 |
| 4,733,285 | 3/1988 | Ishioka et al. | 357/23.13 |
| 4,780,846 | 10/1988 | Tanabe et al. | 357/45 |
| 4,791,607 | 12/1988 | Igaraski et al. | 365/51 |
| 4,807,017 | 2/1989 | Ema et al. | 357/71 |
| 4,833,520 | 5/1989 | Ito et al. | 357/68 |
| 4,841,352 | 6/1989 | Aso | 357/45 |
| 4,851,891 | 7/1989 | Kubosawa et al. | 357/42 |
| 4,862,310 | 8/1989 | Harrington, III | 357/48 |
| 4,888,735 | 12/1989 | Lee et al. | 365/185 |
| 4,947,229 | 8/1990 | Tanaka et al. | 357/68 |

FOREIGN PATENT DOCUMENTS

| | | |
|---|---|---|
| 0237425 | 9/1987 | European Pat. Off. |
| 52-38890 | 3/1977 | Japan |
| 57-104249 | 6/1982 | Japan |
| 59-193045 | 11/1984 | Japan |
| 61-283158 | 12/1986 | Japan ................... 357/48 |
| 62-58668 | 12/1987 | Japan |
| 62-287643 | 12/1987 | Japan ................... 357/74 |

Primary Examiner—Jerome Jackson, Jr.
Assistant Examiner—Viet Q. Nguyen
Attorney, Agent, or Firm—Finnegan, Henderson, Farabow, Garrett and Dunner

[57] ABSTRACT

A semiconductor device comprises a logic circuit and a memory including a timing signal generator circuit, both formed in a substrate, and a wiring connecting the logic circuit to the memory, in which a diffusion layers connected to receive a predetermined potential is located under an area of the wiring situated between the logic circuit and the memory whereby it is possible to alleviate an effect from minority carriers and a substrate potential variation.

8 Claims, 3 Drawing Sheets

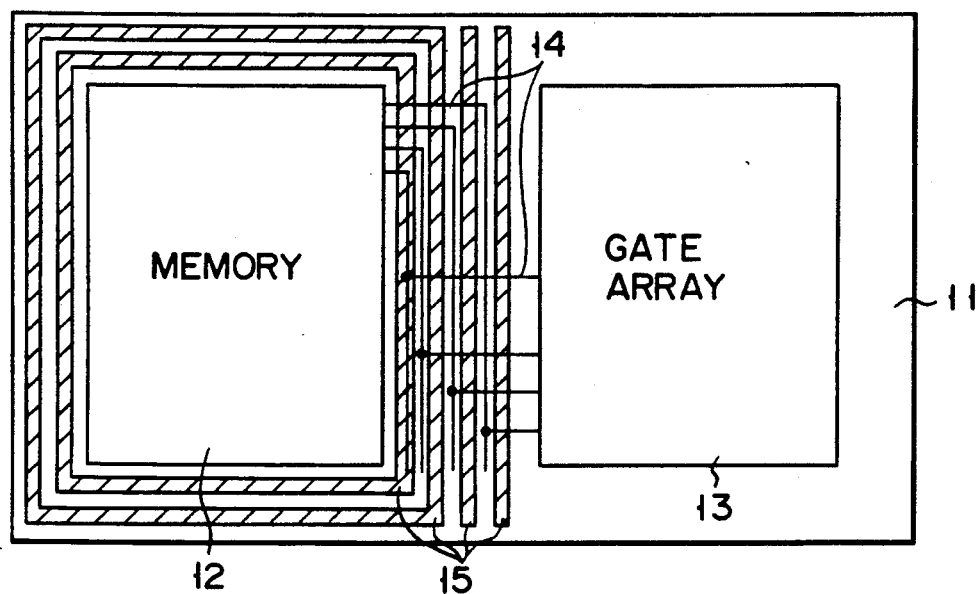
F I G. 1
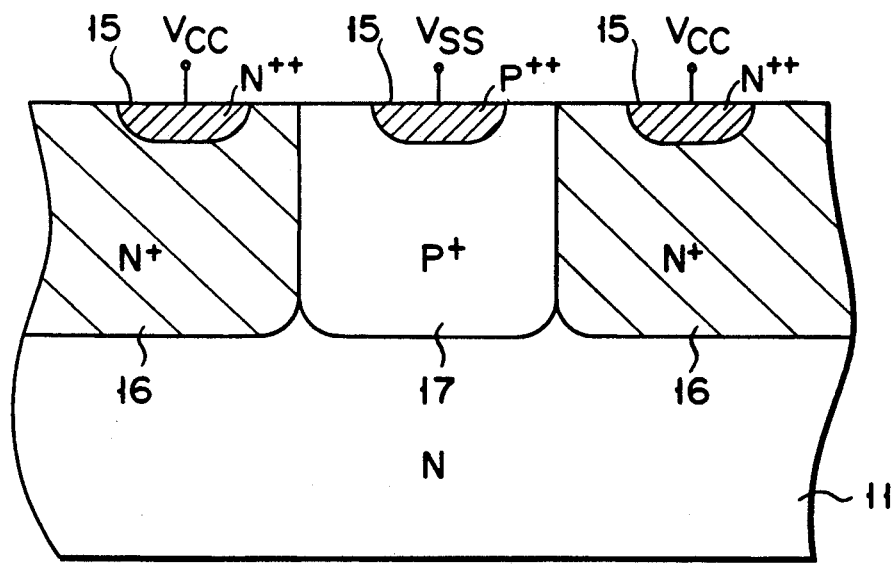
F I G. 2

SEMICONDUCTOR DEVICE

This application is a continuation of application Ser. No. 07/309,571, filed Feb. 13, 1989, now abandoned.

BACKGROUND OF THE INVENTION

1. Field of the Invention

Conventionally, a device is known which includes a logic circuit and small-capacity RAM (Random Access Memory) formed in a common substrate. In order to meet a growing demand for a memory capacity, a greater-capacity RAM is formed in the common substrate. Furthermore, as the logic circuit, use has been made of a gate array which can freely be formed by the user.

2. Description of the Related Art

In a conventional device shown in FIG. 7, large-capacity RAM4, made up of memory cell 2, timing signal generator circuit and so on, and gate array 5 (logic circuit) are formed on substrate 1. Gate array 5 is connected by metal wiring 6 to large-capacity RAM4 to provide a RAM-to-gate array interface.

If the gate array and large-capacity RAM are formed in a common substrate, there is a risk that an operation error will occur due to the interference of noise. That is, the gate array cannot, of necessity, be prepared against minority carriers and a variation in a substrate potential because the user cannot know in detail how a circuit is configured for the gate array. Furthermore, in the gate array, there is a possibility that unused gates will be left unconnected in which case the gate is electrically "floated". The unused gate is turned ON or OFF due to the occurrence of "couplings" and it may be adequately predicted that noise comes from the unused gates. The occurrence of such a noise whose level may be somewhat disregarded in an often statically-operated gate array circuit poses a greater problem in an often dynamically-operated memory circuit. If a memory is used as a dynamic memory in particular, minority carriers encounter the dropping of charges and a noise at the time of refreshing will cause a write-in error. Furthermore, a variation in substrate potential will cause a variation in threshold level and hence mistiming will occur at a timing signal generator circuit, causing a readout error or write-in error. If, as set out above, a memory and gate array are built in a common substrate, a serious situation will arises from a variation in minority carriers and in substrate potential.

SUMMARY OF THE INVENTION

It is accordingly an object of the present invention to provide a semiconductor device in which a plurality of diffusion read layers is formed under an area of a wiring between a logic circuit and a memory including a timing signal generator circuit, both formed in a substrate, and is connected to receive a predetermined potential, whereby it is possible to alleviate an effect from minority carriers and substrate potential variation.

BRIEF DESCRIPTION OF THE DRAWINGS

FIG. 1 is a plan view showing a semiconductor device according to a first embodiment of the present invention;

FIG. 2 is a cross-sectional view showing one form of a plurality of diffusion layers in the semiconductor device of FIG. 1;

DETAILED DESCRIPTION OF THE PREFERRED EMBODIMENTS

Figure 3:
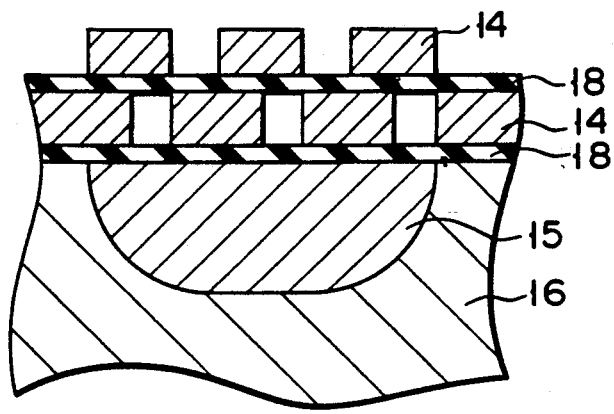
FIG. 3 is a cross-sectional view showing another form of a plurality of diffusion layers of the semiconductor device of the present invention.

Semiconductor devices of the present invention will be explained below with reference to the accompanying drawings.

FIG. 1 shows a semiconductor device according to one embodiment of the present invention. Memory 12, such as a large-capacity DRAM, and gate array 13, such as a logic circuit, are built in substrate 11, noting that memory 12 is formed of a memory peripheral circuit including a memory cell for a DRAM (Dynamic Random Access Memory) and a timing signal generator circuit for supplying various timing signals to the DRAM cell. Gate array 13 is connected to memory 12 by metal wiring 14 to provide a memory-to-gate array interface. Metal wiring 14 is constituted of a plurality of wires for, for example, an address signal and I/O signal. In view of the readiness with which a connection can freely be made at gate array 13, wiring 14 extends substantially horizontal to gate array 13, occupying a considerable area. A plurality of diffusion layers 15 are formed below wiring 14 which is situated between gate array 13 and memory 12. A portion of diffusion layers 15 is so formed as to surround memory 12 including the timing signal generator circuit. For diffusion layers 15 use can be made of one or a plurality of N type, layers and of P-type, layers, in which case it is possible to obtain more effective result. Furthermore, if the memory is surrounded with diffusion layers 15, it is possible to alleviate an effect from minority carriers migrated around the memory and from a variation in substrate potential.

A CMOS (Complementary Metal Oxide Semiconductor) is sometimes manufactured in P- and N-type, well formation processes. As shown in FIG. 2, N+type well 16 and P+type, well 17 are formed in substrate 11, and N++type layers 15 and P++type layers 15 are formed in N+type well 16 and P+type well 17, respectively.

As shown in FIG. 3, as wiring 14 use is made of a plurality of layers formed over substrate 11 with respective insulating layer 18 formed therebetween.

In the case where memory 12 and gate array 13 are to be formed in common substrate 11, there is a risk that an operation error, such as a readout error and write-in error, will occur due to a pronounced adverse effect from minority carriers and from a variation in substrate potential. With a voltage Vcc applied to diffusion layers 15 in N+type, well 16 and a voltage Vss applied to diffusion layers 15 in P+type well 17, the well is so defined as to have a cross-sectional configuration as show in FIG. 2. Although a well potential variation is readily transmitted in a well of the same low resistance type, if different diffusion layers 15 is provided in the well as shown in FIG. 2, a variation in well potential is suppressed, alleviating an effect from the minority carriers and from a variation in substrate potential. Diffusion layers 15 are connected to corresponding power source terminals Vcc and Vss by means of a different wiring than that for memory 12 and gate array 13. By so doing, there is less variation in potential and hence a greater absorption effect against minority carriers and substrate potential variation.

Diffusion layers 15 may be connected to the corresponding power source terminals by means of the same wiring as that for memory 12 and gate array 13.

Although wiring 14 constituting an interface of memory 12 and gate array 13 requires a broader area, if diffusion layers 15 is formed in that portion of substrate situated under the wiring, wiring can be formed without increasing any chip area. In this case, a greater effect can be obtained at diffusion layers 15 if the wires (wiring) are increased in number.

Figure 4:
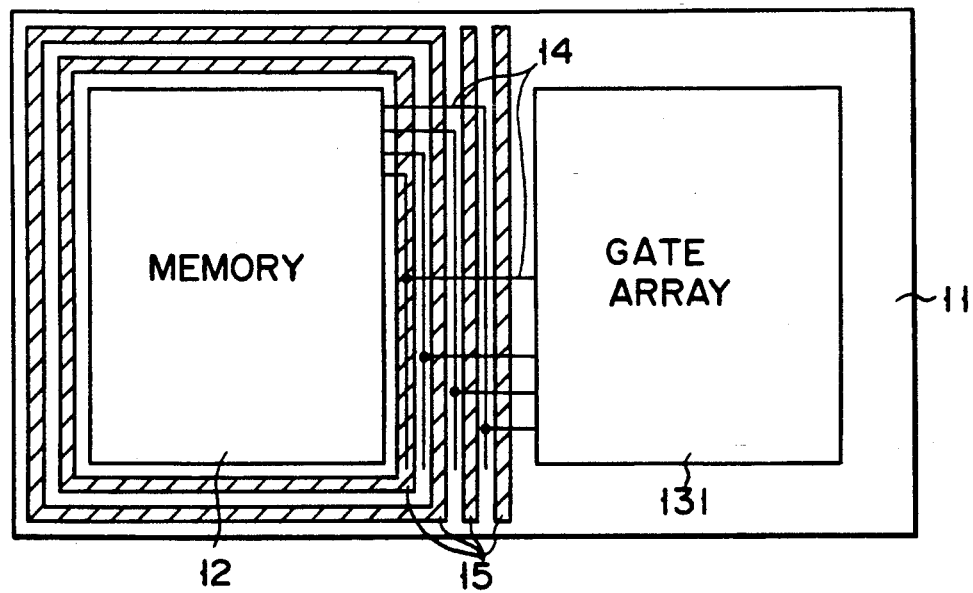
FIG. 4 is a plan view showing a semiconductor device according to a second embodiment of the present invention.
Figure 5:
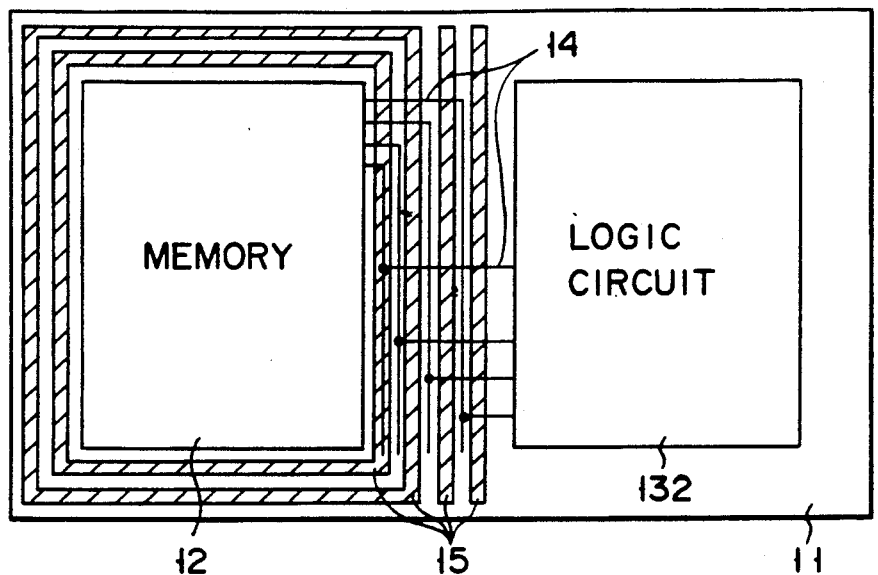
FIG. 5 is a plan view showing a semiconductor device according to a third embodiment of the present invention.
Figure 6:
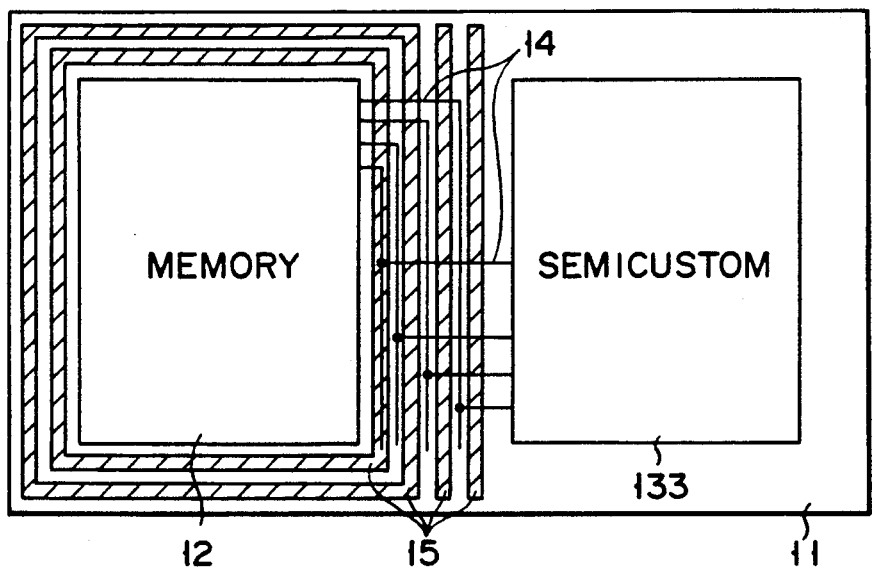
FIG. 6 is a plan view showing a fourth embodiment of the present invention.
Figure 7:
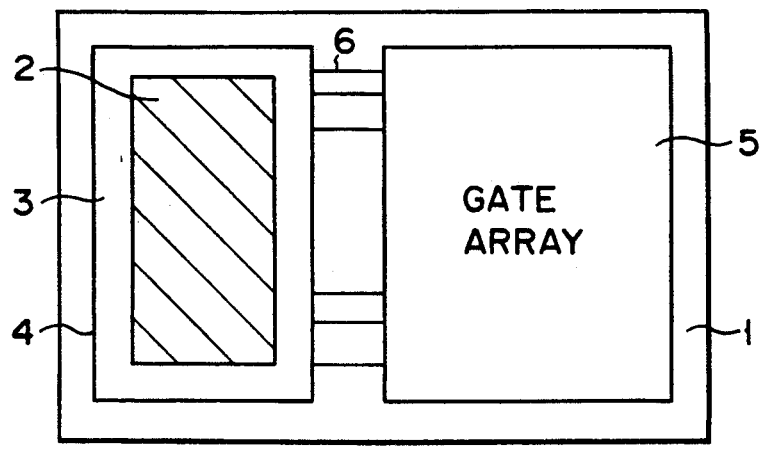
FIG. 7 is a plan view showing a conventional semiconductor device.

Although, in the first embodiment, gate array 13 has been explained as being employed as the logic circuit, a whole area element type gate array (channelless gate array) 131 may be employed as gate array 13 as shown in FIG. 4. Use may also be made of logic circuit 132 including a gate array as shown in FIG. 5 or semicustom IC 133 may be used as logic circuit 132 as shown in FIG. 6.

According to the present invention, as set out above, the diffusion layers is provided under the wiring area between the logic circuit and the memory including a timing signal generator circuit, thereby alleviating an effect from minority carriers across the memory and the logic circuit and from a substrate potential variation.

What is claimed is:

1. A semiconductor device comprising:
   a substrate;
   a memory device formed in said substrate, said memory device including a timing signal generator;
   a gate array formed in said substrate;
   a first wiring formed on said substrate, said first wiring connecting said gate array to said memory device;
   a P+ type well formed in said substrate below said first wiring between said gate array and said memory device;
   an N+ type well formed in said substrate below said first wiring between said gate array and said memory device;
   a P++ type layer having a first voltage Vss applied thereto, and formed inside said P+ type well, said first voltage fixing a first potential of said P+ type well; and
   an N++ type layer having a second voltage $V_{cc}$ applied thereto, and formed inside said N+ type well, said second voltage fixing a second potential of said N+ type well different from the first potential of said P+ type well.

2. The semiconductor device according to claim 1 in which said P type and N type layers surround said memory device.

3. The semiconductor device according to claim 1, further including power source terminals, and said P type and N type layers are connected to said power source terminals by a second wiring, said second wiring being separate from said first wiring.

4. The semiconductor device according to claim 1, in which said first wiring extends between said memory device and said logic circuit in a parallel relation to the logic circuit.

5. The semiconductor device according to claim 1, in which said memory comprises of a dynamic random access memory.

6. The semiconductor device according to claim 1, further including an insulator disposed between said substrate and said first wiring.

7. The semiconductor device according to claim 1, wherein said first wiring includes at least a first group and a second group of wirings, and a first insulator disposed between said first group and said second groups of wirings.

8. The semiconductor device according to claim 7, further including a second insulator between said substrate and said first groups of wirings.

* * * * *